United States Patent
Colombo et al.

(10) Patent No.: US 6,461,922 B1
(45) Date of Patent: Oct. 8, 2002

(54) METHOD FOR THE INTEGRATION OF RESISTORS AND ESD SELF-PROTECTED TRANSISTORS IN AN INTEGRATED DEVICE WITH A MEMORY MATRIX MANUFACTURED BY MEANS OF A PROCESS FEATURING SELF-ALIGNED SOURCE (SAS) FORMATION AND JUNCTION SALICIDATION

(75) Inventors: Paolo Colombo, Tradate; Alfonso Maurelli, Sulbiate, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/464,066

(22) Filed: Dec. 15, 1999

(30) Foreign Application Priority Data

Dec. 16, 1998 (EP) .............................. 98830757

(51) Int. Cl.[7] ............................ H01L 21/331
(52) U.S. Cl. .................. 438/299; 438/301; 438/303; 438/305; 438/306
(58) Field of Search ................. 438/303, 305, 438/299, 300

(56) References Cited

U.S. PATENT DOCUMENTS

| | | | |
|---|---|---|---|
| 4,703,551 A | * 11/1987 | Szluk et al. ................. 437/30 |
| 4,946,799 A | * 8/1990 | Blake et al. ................. 437/41 |
| 5,047,358 A | * 9/1991 | Kosiak et al. ............... 437/34 |
| 5,441,906 A | 8/1995 | Burger ........................ 437/41 |
| 5,480,830 A | * 1/1996 | Liao et al. ................... 437/58 |
| 5,610,089 A | 3/1997 | Iwai et al. ................... 437/34 |
| 5,757,083 A | * 5/1998 | Yang ......................... 257/903 |
| 6,114,226 A | * 9/2000 | Chang et al. .............. 438/510 |

* cited by examiner

Primary Examiner—David Nelms
Assistant Examiner—Thao Le
(74) Attorney, Agent, or Firm—Lisa K. Jorgenson; E. Russell Tartleton; SEED IP Law Group PLLC (57) ABSTRACT

A method of forming a doped region in an integrated circuit which includes a matrix of memory cells and lightly-doped drain transistors and which is fabricated by means of a process providing for a Self-Aligned Source masked etch and implant and for a selective salicidation of some doped regions, the doped region suitable for forming an integrated resistor and/or an abrupt-profile source/drain region of a transistor. The doped region is formed by introducing into a semiconductor layer of a first conductivity type a dopant of a second conductivity type and exploiting the SAS masked implant used to form source regions of the matrix of memory cells. At least a portion of a surface of the doped region is prevented from being salicidated by using as a protective mask a portion of a dielectric layer from which insulating sidewall spacers for the LDD transistors are formed.

13 Claims, 6 Drawing Sheets

METHOD FOR THE INTEGRATION OF RESISTORS AND ESD SELF-PROTECTED TRANSISTORS IN AN INTEGRATED DEVICE WITH A MEMORY MATRIX MANUFACTURED BY MEANS OF A PROCESS FEATURING SELF-ALIGNED SOURCE (SAS) FORMATION AND JUNCTION SALICIDATION

TECHNICAL FIELD

The present invention relates to the manufacturing of integrated circuits. More particularly, the invention relates to integrated circuits including a memory matrix manufactured by means of a process featuring self-aligned source formation and junction salicidation. Still more particularly, the invention concerns the integration in such integrated circuits of resistors and ESD (electro static discharge) protection elements.

BACKGROUND OF THE INVENTION

Protection against ESD is a key issue in integrated circuits, and it is especially important in MOS integrated circuits such as memories.

MOS transistors with abrupt profile source/drain junctions are known to have a higher ESD ruggedness than LDD (lightly-doped drain) transistors. A possible explanation of this is that in an abrupt junction MOS transistor, the associated parasitic bipolar transistor that turns on by snap-back when a high-current ESD surge is applied has a deeper conduction (lower current density for a given dissipated power) than in the case of an LDD transistor.

On the other hand, it is also known that transistors having abrupt profile source/drain junctions are generally not used as elements of a logic circuitry (e.g., logic gates) in an integrated device. Such transistors are in fact affected by problems of hot-electron injection into the gate oxide. Injection of hot electrons into the gate oxide causes changes in the electrical parameters of the transistors. These problems are instead avoided using LDD transistors.

The problems of hot-electron injection become however less significant the longer the transistors' channel. However, the use of long-channel transistors is normally avoided in the logic circuitry.

On the contrary, output buffers having a long-channel transistor is not a real limitation, especially for the pull-down part. Output buffers, being directly connected to input/output (I/O) pads, can experience electro static discharges, so the use of long-channel, abrupt junction profile transistors for output buffers is a possible way to obtain ESD self-protect output buffers.

Using a self-protected structure has the advantage that no additional, dedicated ESD protection circuitry is to be provided. This reduces the size of the I/O cells. Also, when a dedicated ESD protection structure is used, further elements such as resistors are to be provided to limit the current drawn by the protected circuitry in favor of the protection circuitry. In the case of output buffers, this means that resistors are normally placed in series with the pull-down transistors in order to limit the surge current flowing therethrough, in favor of the ESD protection circuitry. The drawback is that in normal operation the switching time of the output buffer is negatively affected.

A self-protected transistor must however comply with some layout rules that are typical of protection structures. Considering the high current value of an ESD surge, such a current must be distributed along the whole transistor width. Typically, the source/drain contacts are kept significantly distant from the transistor's gate so to introduce a local resistance (ballast resistor) that prevents current crowding.

SUMMARY OF THE INVENTION

The integration of ESD self-protected transistors as described above is not straightforward in integrated circuits of the current generation. The following technological innovations are to be kept into suitable account.

On the one hand, current manufacturing processes for integrated circuits with a memory matrix provide for the formation of self-aligned source (SAS) diffusion lines inside the matrix of memory cells. First, field oxide strips are formed in the memory matrix area, the field oxide strips separated by active area strips; then, word lines perpendicular to the field oxide strips are defined; a selective etching of the field oxide strips is then provided, so as to remove field oxide portions among alternate pairs of word lines and thus form strips of uncovered substrate where source diffusion lines will be formed; subsequently, a dopant such as As is implanted in a heavy dose (approximately $10^{15}$ atoms/cm$^2$) to form the source diffusion lines at the strips of uncovered substrate. The SAS technique allows for high integration densities. In some cases, depending on the desired performance of the memory cells, an additional implant of phosphorus of lower dose ($10^{14}$ atoms/cm$^2$) can be provided, so to have source junctions with more gradual profile.

Another improvement in the manufacturing processes of the current generation is junction salicidation. This technique, which provides for a substantial reduction of the resistivity of the doped regions, is essential in order to improve high-frequency performance of the devices. Salicidation provides for depositing over the doped regions a layer of a transition metal, typically Ti; the layer of transition metal is then thermally activated to form a low-resistivity layer (salicide, e.g., TiSi$_2$) over the doped regions.

Both the SAS and the salicidation techniques are commonly employed in the manufacturing of integrated circuits.

Normally, a dedicated mask is provided to avoid salicidation of some of the doped regions in the integrated circuit. For example, low doped regions such as these lightly-doped source/drain portions of LDD transistors must not be affected by salicidation, otherwise this lightly-doped, rather shallow regions could easily be totally consumed during formation of the salicide. Another case where salicidation is to be avoided is over some N+ doped regions that are to be used to form diffused resistors with resistivity of the order of 50 Ω/square meter. Integrated resistors of this type are very useful in integrated circuits: firstly, they have a lower resistivity than that of resistors obtainable from lightly-doped N− regions (2000 Ω/square meter) and from N type wells (1000 Ω/square meter); secondly, resistors formed from N+ regions have a linear behavior against voltage. Resistors of this kind are for example used as ballast resistors in ESD protection structures.

The present invention provides a method that, in the context of a standard manufacturing process for integrated circuits with memory matrixes providing for a SAS masked etch and implant and junction salicidation, is suitable for obtaining doped regions that can be used to form integrated resistors with linear behavior and/or abrupt-profile source/drain regions for ESD self-protected transistors.

The foregoing is achieved by means of a method of forming a doped region in an integrated circuit which includes a matrix of memory cells and lightly-doped drain (LDD) transistors and which is fabricated by means of a process providing for a self-aligned source (SAS) masked etch and implant and for a selective salicidation of some doped regions, the doped region suitable for forming an integrated resistor and/or an abrupt-profile source/drain region of a transistor. Further included is:

the doped region formed by introducing into a semiconductor layer of a first conductivity type a dopant of a second conductivity type, exploiting the SAS masked implant used to form source regions of the matrix of memory cells; and at least a portion of a surface of the doped region is prevented from being salicidated by using as a protective mask a portion of a dielectric layer from which insulating sidewall spacers for the LDD transistors are formed.

The method of the present invention has the advantage of allowing the formation of a doped region that can be used both as an integrated resistor and as an abrupt-profile source/drain region for an ESD self-protected transistor, without any additional step compared to a standard manufacturing process of the current generation for integrated circuits including memory matrixes. Using the doped region formed by means of the method according to the present invention as a drain/source region for ESD self-protected transistors avoids the necessity of fulfilling particular layout rules as described above, since such a doped region not only gives rise to an abrupt-profile source/drain junction, but it also intrinsically includes a ballast resistor. For example, there is no more the necessity to have source/drain contacts spaced apart from the gate of the transistor.

BRIEF DESCRIPTION OF THE DRAWINGS

The features of the present invention will be made apparent by the following detailed description of some practical embodiments thereof, illustrated by way of non-limiting examples only in the annexed drawings, wherein:

FIGS. 3A, 3B, 3C to 6A, 6B, 6C, and 8A, 8B, 8C to 10A, 10B, 10C respectively show in cross-section fabrication steps of an ESD self-protected transistor, a drain extended (DREX) transistor and a resistor after the SAS etch and implant;

DETAILED DESCRIPTION OF THE INVENTION

Figure 1:
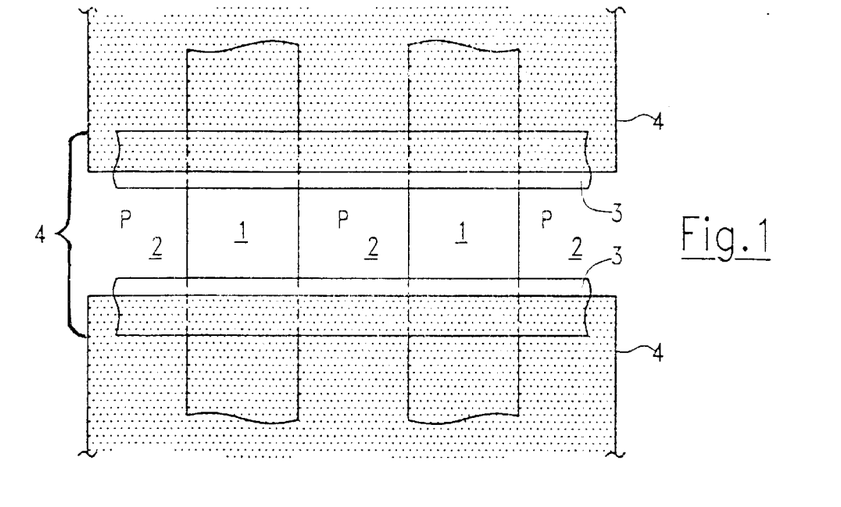
FIG. 1 shows in top-plan view a portion of a memory cell matrix, with superimposed a SAS mask before the SAS etch.

FIG. 1 shows, rather schematically, a portion of an integrated circuit wherein a matrix of memory cells is to be formed. The memory cells can be for example non-volatile memory cells, e.g., EEPROM or Flash EEPROM cells. In FIG. 1 the memory cell matrix is shown at a manufacturing stage just before the self-aligned source etching. It is possible to see field oxide strips 1 separated by active area strips 2 (i.e., strips of free semiconductor substrate); word lines 3 run orthogonally to the field oxide and active area strips. A SAS mask 4 is applied to the circuit. As visible, the SAS mask has openings between the word lines, so to leave unprotected strips where source diffusion lines for the memory cell matrix will be formed.

Figure 2:
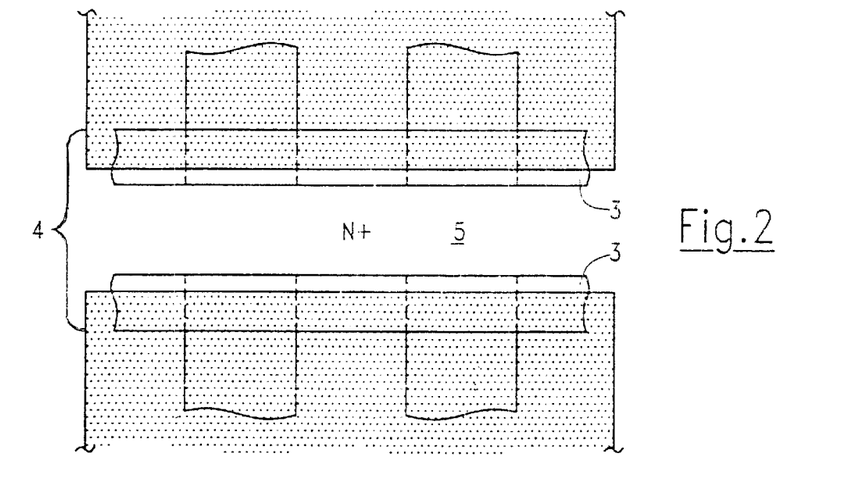
FIG. 2 shows the portion of memory cell matrix of FIG. 1, after the SAS etch and implant.

Using the SAS mask 4, an etching is performed so that the exposed portions of the field oxide strips 1 are removed. Then, still using the SAS mask, an N type dopant is implanted to form N+ source diffusion lines 5. The resultant structure is shown in FIG. 2. Typically, the dopant used is As, and the implanted dose is of the order of $10^{15}$ atoms/$cm^2$, e.g., $1\times10^{15}$ to $5\times10^{15}$ atoms/$cm^2$. In this way, the source diffusion lines 5 have a low resistivity.

Figure 3A:
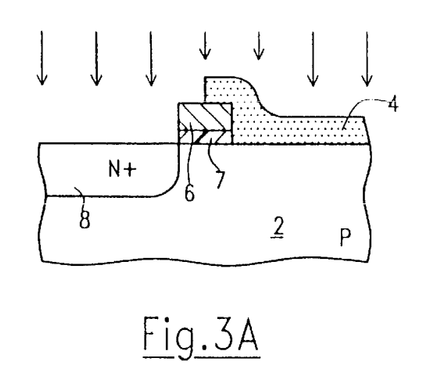
Figure 3B:
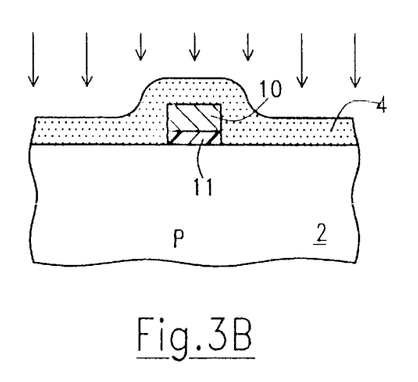
Figure 3C:
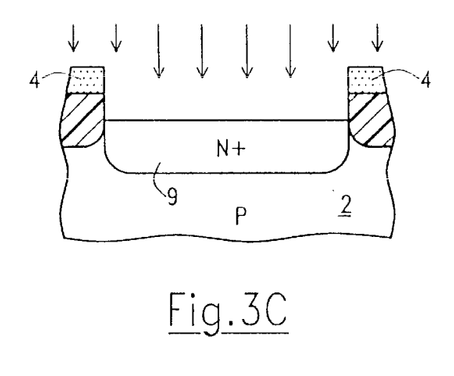

According to one embodiment of the invention, the SAS masked implant, normally used for the formation of source diffusion lines of the memory matrix, is also used for the formation of an ESD self-protected transistor having abrupt-profile source/drain junctions (FIG. 3A) and for the formation of an integrated resistor (FIG. 3C). More precisely, in FIG. 3A a portion of the integrated circuit where an abrupt-profile source/drain junction transistor is to be formed is shown. Such a transistor has a conventional polysilicon gate 6 isolated from the semiconductor substrate by a gate oxide 7. In FIG. 3A the SAS mask 4 covers one side of the transistor, so that the dopant (As as specified above) is only implanted at the other side. This means, that in this case the transistor will have only one abrupt-profile junction, for example the source one. However, if it is desired to form transistors with both source and drain abrupt junctions, then the layout of the SAS mask 4 can be modified to leave uncovered both sides of the transistor. The implanted (As) dopant forms an N+ source region 8 having an abrupt profile; source region 8 has the same dopant concentration and thickness as the source diffusion lines of the memory matrix. Similarly, the SAS mask leaves uncovered a region of the integrated circuit where an integrated resistor is to be formed, as shown in FIG. 3C. The SAS implant used for the formation of the source diffusion lines of the memory matrix is then also performed in the region of the integrated resistor, so that a diffused resistor 9 is formed. On the contrary, those regions of the integrated circuit wherein conventional LDD transistors or drain extended transistors are to be formed are completely covered by the SAS mask to prevent the implantation of the (As) dopant. This is shown in FIG. 3B, wherein a polysilicon gate 10 for a Drain Extended transistor is shown, isolated from the substrate 2 by a respective gate oxide 11. N+ source diffusion lines 5 of the memory matrix, and N+ regions 8 and 9 have a dopant concentration of $3\times10^{20}$ to $6\times10^{20}$ atoms/$cm^3$ and a depth of 0.2–0.3 $\mu$m.

The SAS mask 4 is subsequently removed.

Figure 4A:
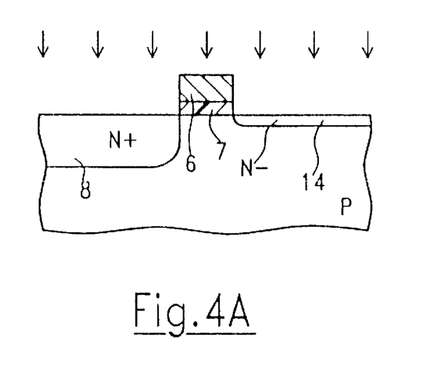
Figure 4B:
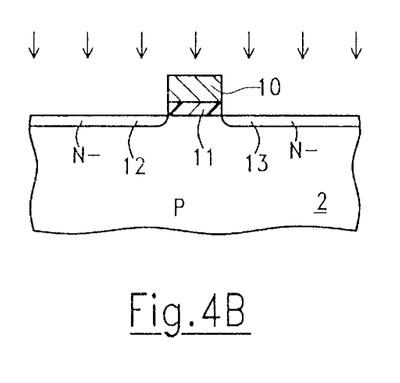
Figure 4C:
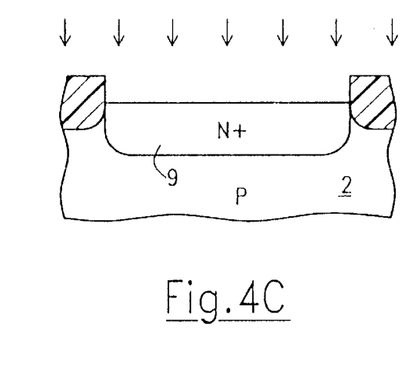

The following step of the manufacturing process provides for the conventional low-dose implant for the formation of lightly-doped source/drain regions of LDD transistors. The dopant is normally phosphorus, and it is implanted in a dose on the order of $10^{13}$ atoms/$cm^2$, e.g., $1\times10^{13}$ to $2\times10^{13}$ atoms/$cm^2$. As visible in FIG. 4B, by means of this implant, the lightly-doped N– source and drain regions 12, 13 for the drain extension transistors (and also lightly-doped source and drain regions for the LDD transistors) are formed. This implant is also performed in the regions of the circuit where ESD self-protected transistors are to be formed, as shown in FIG. 4A. At the source side of the transistor, where the N+ source region 8 was previously formed, the light phosphorus implant does not modify the doping level of the source region 8. At the drain side, which in this example was masked during the previous implant, the light implant allows for forming a lightly-doped N– drain region 14. Similarly, the light implant is performed in the region of the chip of FIG. 4C where the integrated resistor is to be formed. Also in this case, the light implant does not alter the dopant concentration of region 9. The lightly-doped regions 12, 13, 14 have a dopant concentration of $3 \times 10^{18}$ to $4 \times 10^{18}$ atoms/cm$^3$ and a depth of 0.1–0.2 µm.

Figure 5A:
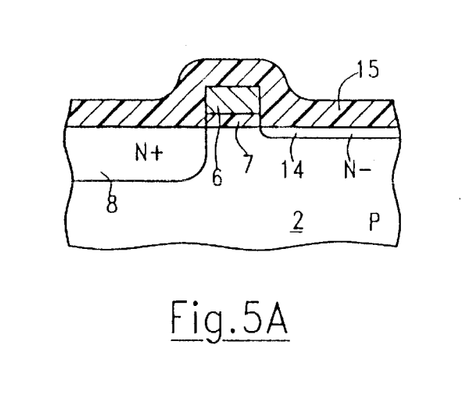
Figure 5B:
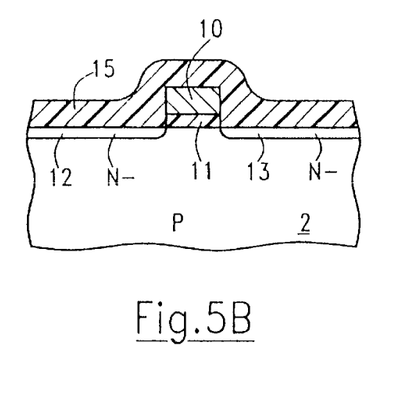
Figure 5C:
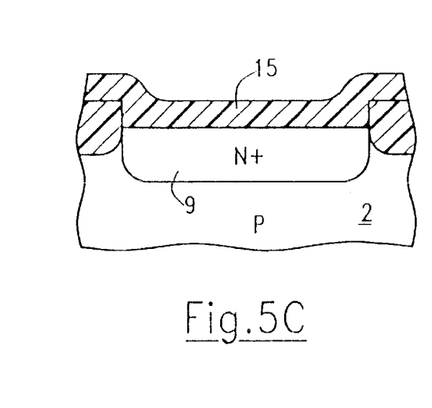

A dielectric layer 15, such as a TEOS layer, is then deposited over the integrated circuit. The dielectric layer 15 is normally used for the subsequent formation of insulating spacers at the sides of the gates of LDD and drain extended transistors. As shown in FIGS. 5A, 5B and 5C, the dielectric layer 15 covers the region of the ESD self-protected transistor, the region of the drain extended transistor, and the region of the integrated resistor.

Figure 6A:
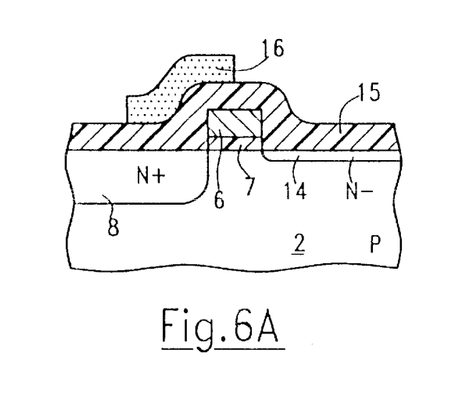
Figure 6B:
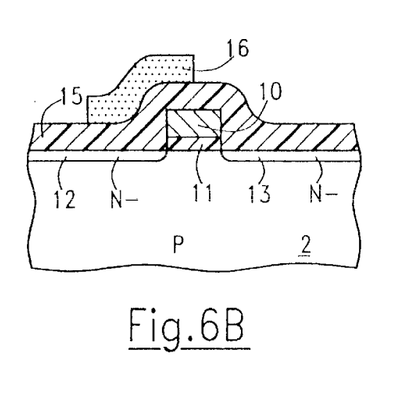
Figure 6C:
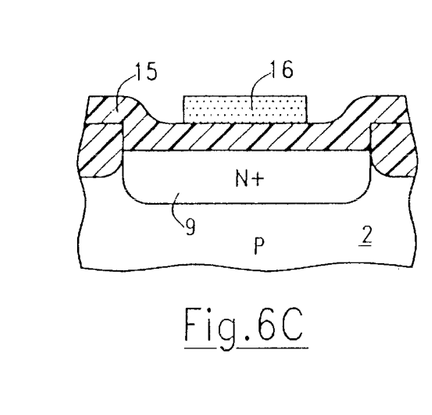

A mask 16 is then applied to the integrated circuit. Mask 16 is used to prevent etching of the dielectric layer 15 in particular regions of the integrated circuit. More precisely, mask 16 is for example used in respect of drain extended transistors, such as the one shown in FIG. 6B. In the context of the present invention mask 16 is also applied to the ESD self-protected transistors (FIG. 6A) and to the integrated resistors (FIG. 6C).

After applying mask 16, an etching process is performed to remove the dielectric layer 15 where it is not protected by mask 16. By this etching step, insulating sidewall spacers are formed at the sides of the gates of LDD transistors. A similar insulating spacer 18 is formed at one side only (drain side in this example) of the drain extended transistor shown in FIG. 8B. The other side (source side), being protected at least partially by mask 16, remains partially covered by the dielectric layer 15. Similarly, mask 16 covers a portion (e.g., a central portion) of the integrated resistor area, so that after the etching said portion remains covered by the dielectric layer 15 (FIG. 8C).

Figure 7:
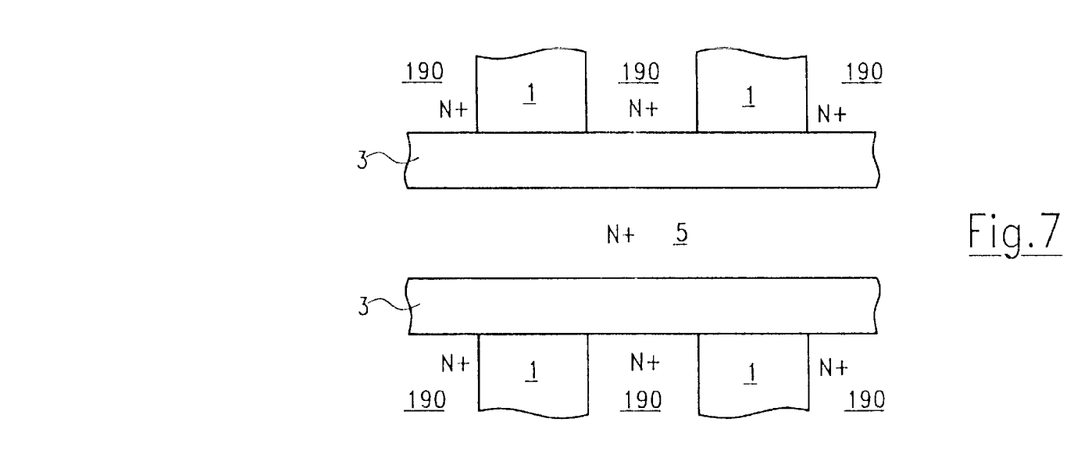
FIG. 7 shows the portion of memory cell matrix of FIGS. 1 and 2, at a stage corresponding to that shown in FIGS. 8A, 8B, 8C.

After the etching of the dielectric layer 15, a dopant is implanted to form source and drain regions of the LDD transistors. The dopant is normally AS, and the typical implant dose is $4 \times 10^{15}$ atoms/cm$^2$. This same implant is used to form drain regions 190 for the memory cells in the memory matrix, as shown in FIG. 7. The same implant is also used to form N+ source and drain regions 19, 20 for the drain extended transistor, as shown in FIG. 8B. At the drain side, spacer 17 prevents the dopant from being implanted close to the gate edge, so that the final drain region will have a lightly-doped portion 13 near the gate and a heavily-doped portion 20 spaced apart from the gate edge. At the source side, the presence of the dielectric layer 15, which was not removed during the previous etching step, prevents the dopant from being implanted in an extended portion of the lightly-doped source region 12. The final source region will comprise an extended lightly-doped portion 12, and a spaced apart heavily-doped portion 19.

Figure 8A:
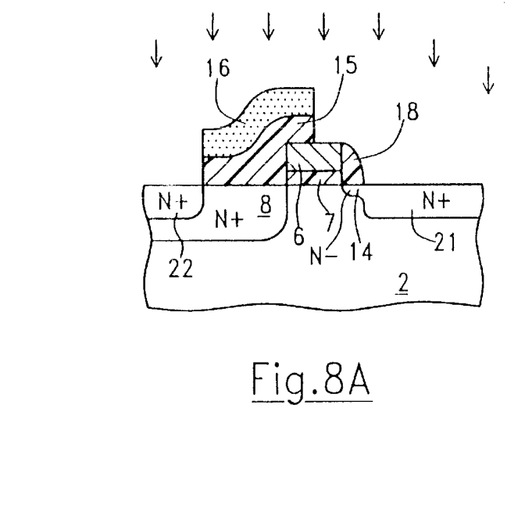
Figure 8B:
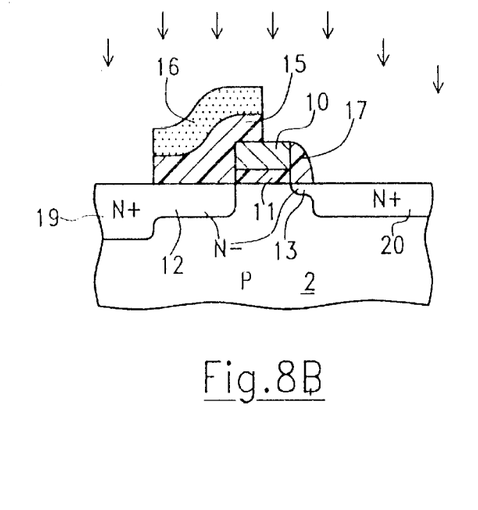
Figure 8C:
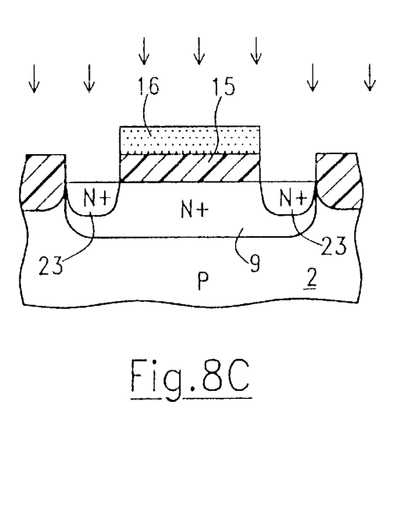

Something similar occurs for the ESD self-protected transistor in FIG. 8A. At the drain side, where spacer 18 was formed, the implanted dopant forms an N+ drain region 21, while at the source side, partially covered by the dielectric layer 15, an N+ region 22 is formed distant from the gate edge.

Still similarly, in the region for the integrated resistor, the dopant is only implanted at two ends of the N+ region, not covered by the dielectric layer 15, to form two heavily doped regions 23.

The N+ regions 19, 20, 21, 22 and 23 have a dopant concentration of $3 \times 10^{20}$ to $6 \times 10^{20}$ atoms/cm$^3$ and a depth of 0.2–0.3 µm.

A salicidation of some doped regions of the integrated circuit is then carried out. A layer of a transition metal is first deposited, for example a layer of Ti. Then, a thermal process is performed to make the transition metal react with crystalline or polycrystalline silicon and form a layer of metal silicide. Where the transition metal does not lay over crystalline or polycrystalline silicon, no silicide is formed, and the transition metal is subsequently removed. As shown in FIG. 9B, a silicide layer 24 is formed over the N+ drain region 20 and over the N+ source region 19 of the drain extended transistor. A silicide layer is neither formed over the N− drain portion 13 under spacer 17 nor over the extended N− source portion 12 under the dielectric layer 15.

Figure 9A:
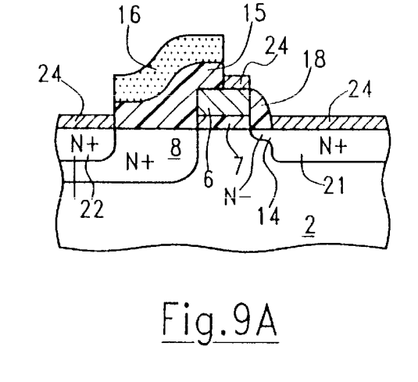
Figure 9B:
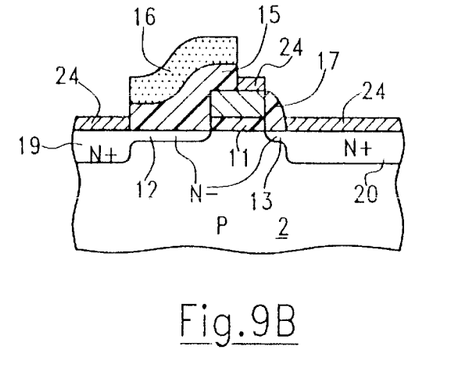

Similarly, as shown in FIG. 9A, for the ESD self-protected transistor a silicide layer 24 is formed over the N+ drain portion 21, and over the N+ source portion 22. A silicide layer is neither formed over the N− drain portion 14 under spacer 18 nor over the N+ source portion 8 covered by the dielectric layer 15.

Figure 9C:
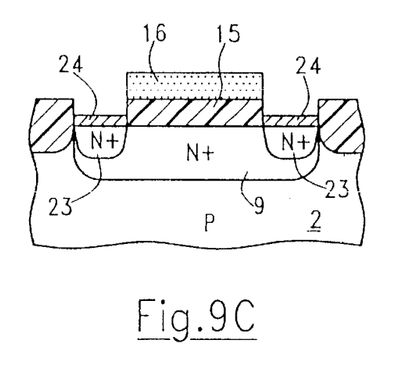

In the integrated resistor in FIG. 9C, a silicide layer 24 is only formed over the N+ regions 23. The portion of the N+ doped region 9 between N+ regions 23 of integrated resistor has a resistivity value suitable to form the desired resistor. Furthermore, the resistor thus formed has a linear behavior.

Figure 10A:
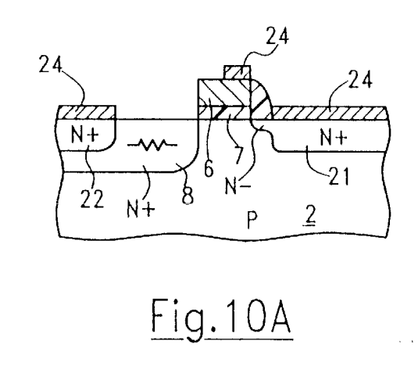
Figure 10B:
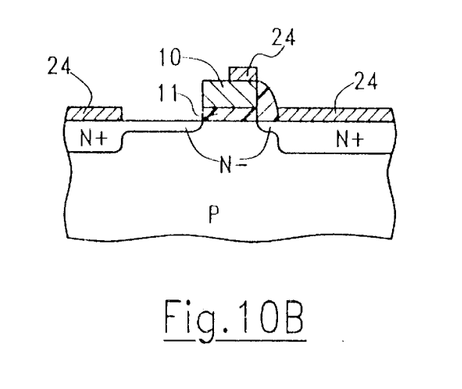
Figure 10C:
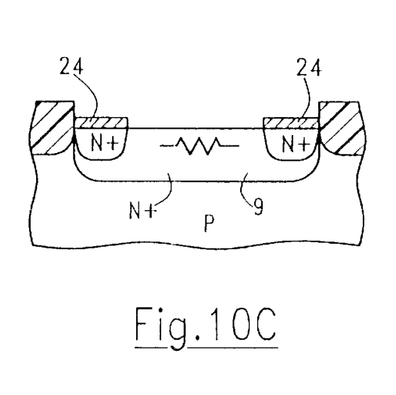
Figure 11:
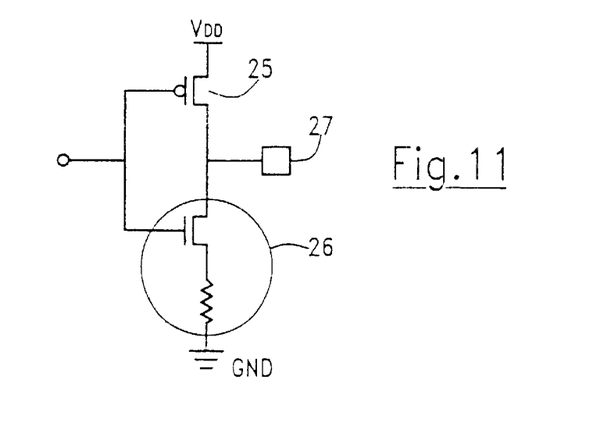
FIG. 11 is a schematic electrical diagram of an ESD self-protected output buffer.

Then, the mask 16 and the dielectric layer 15 are removed, and the structures shown in FIGS. 10A, 10B, 10C are obtained. As shown in FIG. 10A, the N+ portion 8 of the source region of the ESD self-protected transistor that is not covered by the silicide layer forms a ballast resistor. FIG. 11 is a schematic electrical representation of an output buffer for an integrated circuit wherein the transistor shown in FIG. 10A can be used to form an ESD self-protected circuit. The output buffer is substantially a CMOS inverter, with a pull-up transistor 25 and a pull-down transistor 26 driving an output pad 27.

Figure 12:
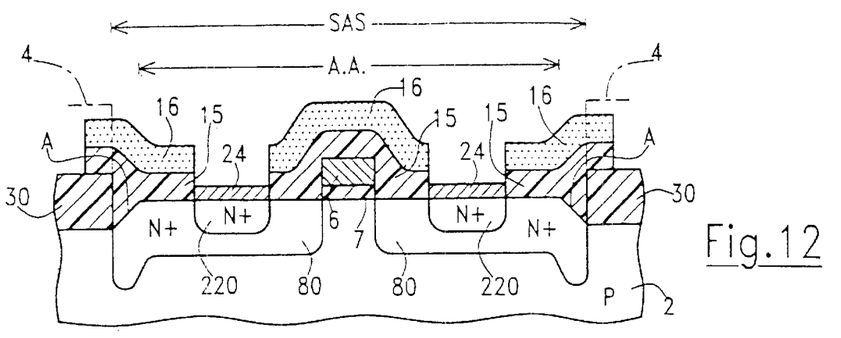
FIGS. 12, 13 and 14 show in cross-section three alternative embodiments of an ESD self-protected transistor.
Figure 13:
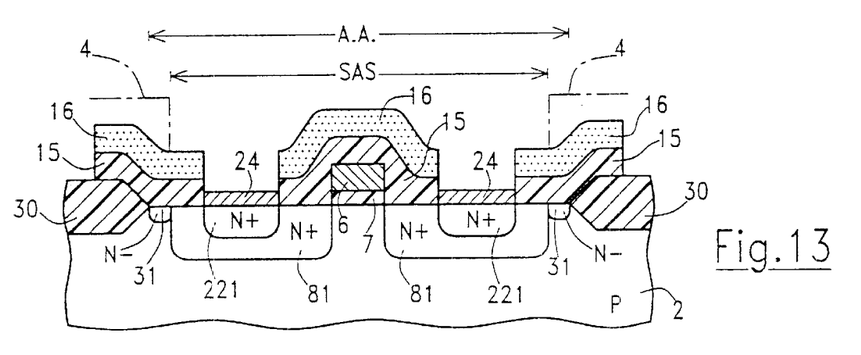
Figure 14:
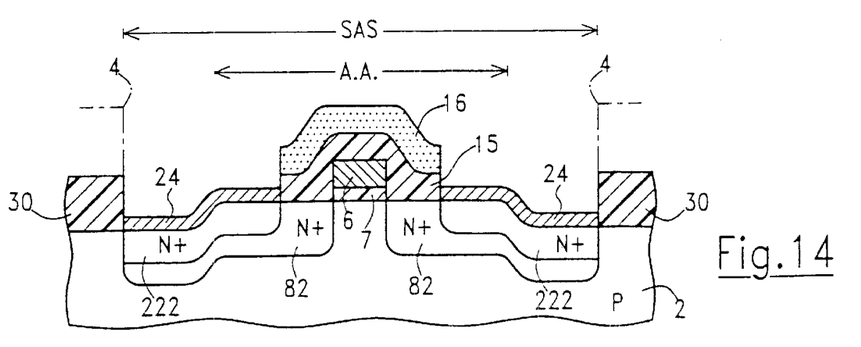

FIGS. 12, 13 and 14 show cross-sectional views of three different embodiments of ESD self-protected transistors that can be obtained is accordance with the present invention. Differently from the embodiment previously described, the three embodiments of FIGS. 12 to 14 are symmetrical. The three new embodiments differ in respect of the extension of the SAS mask 4 compared to the active area mask (indicated with A.A. in FIGS. 12 to 14). The active area mask is the mask used to define active areas over the substrate 2, i.e., areas of the substrate free of thick field oxide 30.

In the embodiment of FIG. 12 the opening in the SAS mask 4 laterally extends beyond the active area A.A. Due to the particular profile A of the source and drain junctions, resulting from the etching of the field oxide 30, the electric field lines are denser and a breakdown of the junction towards the gate can occur at a lower voltage. This is a drawback of this structure.

In the embodiment of FIG. 13 the opening in the SAS mask 4 is narrower than the active area A.A. The resulting structure is planar, and N− regions 31 are formed adjacent the edge of the field oxide 30. This structure is optimized for ESD, since the corners of FIG. 12 have been avoided. The breakdown current causing the turning on for snap-back of the parasitic lateral NPN bipolar transistor is effectively limited to the base region of such a parasitic transistor, under the gate. However, the necessity of not forming a salicide layer over the N− regions 31 may require fulfilling some layout rules that increase the overall size of the structure.

In the embodiment of FIG. 14 the active area A.A. is only limited to the channel region of the transistor, while the opening in the SAS mask 4 is wider than the active area, so that the SAS etching and implant define the contact regions for the transistor. This structure avoids the drawback of the structure shown in FIG. 13. The SAS etching is only used to open the contact regions.

While preferred embodiments of the invention have been illustrated and described, it is to be understood that various changes maybe made therein known to those skilled in the art without departing from the spirit and scope of the invention. Thus, the invention is to be limited only by the scope of the claims that follow.

What is claimed is:

1. A method of forming a doped region in an integrated circuit that includes a matrix of memory cells and lightly-doped drain (LDD) transistors and which is fabricated by means of a process providing for a self-aligned source (SAS) masked etch and implant and for a selective salicidation of certain doped regions, the doped regions suitable for forming an integrated resistor and/or an abrupt-profile source/drain region of a transistor, the method comprising:

forming a doped region by introducing into a semiconductor layer of a first conductivity type a dopant of a second conductivity type and exploiting an SAS masked implant to form source regions of the matrix of memory cells;

implanting a low dose of a second dopant of the second conductivity type for forming lightly-doped source/drain region portions for the LDD transistors;

covering at least a portion of a surface of the doped region to prevent it from being salicidated by using as a protective mask a portion of a dielectric layer from which insulating sidewall spacers for the LDD transistors are formed;

implanting a third dopant of the second conductivity type to form heavily-doped source/drain region portions for the LDD transistors; and forming a salicide layer over said heavily-doped source/drain region portions.

2. The method of claim 1, wherein said dopant is As, and the implant dose is in the range of $1 \times 10^{15}$ to $5 \times 10^{15}$ atoms/cm$^2$.

3. The method of claim 1, wherein said etching of the dielectric layer is a masked etching so that etching of the dielectric layer is prevented over lightly-doped source/drain region portions for LDD transistors that have an extended lightly-doped source/drain portion and over said at least a portion of the surface of the doped region, said third dopant is implanted using the maskedly etched dielectric layer as a mask to prevent the third dopant from being implanted into the extended lightly-doped source/drain region portions of LDD transistors and into said at least a portion of the surface of the doped region, and said salicide layer is selectively formed using the maskedly etched dielectric layer as a mask so as to prevent formation of the salicide layer over the extended lightly-doped source/drain region portions of LDD transistors and over said at least a portion of the surface of the doped region.

4. The method of claim 3, wherein said third dopant is also implanted into the matrix of memory cells to form drain regions for the memory cells.

5. The method of claim 4, wherein said second dopant is phosphorus and is implanted in a dose in the range of $1 \times 10^{13}$ to $2 \times 10^{13}$ atoms/cm$^2$.

6. The method of claim 4, wherein said third dopant is AS and is implanted in a dose of the order of $4 \times 10^{15}$ atoms/cm$^2$.

7. A method of forming a transistor having ESD regions, comprising:

forming a self-aligned source (SAS) mask on a semiconductor layer;

implanting a first dopant in the semiconductor layer using the SAS mask;

removing the SAS mask;

implanting a second dopant in the semiconductor layer;

forming a dielectric layer over one or more selected regions on the semiconductor layer, including the ESD regions;

implanting a third dopant in non-selected regions not covered by the dielectric layer;

forming a salicide layer over the non-selected regions; and removing the dielectric layer.

8. The method of claim 7, wherein a semiconductor layer is formed of material of a first conductivity type; and the first, second, and third dopants are of a second conductivity type.

9. The method of claim 7, wherein the implanting of the second dopant forms lightly-doped regions; and the implanting of the third dopant forms heavily-doped regions.

10. The method of claim 7, wherein the second dopant comprises phosphorous.

11. The method of claim 10, wherein the phosphorous is implanted in a dose in the range of $1 \times 10^{13}$ to $2 \times 10^{13}$ atoms/cm$^2$.

12. The method of claim 7, wherein the third dopant comprises As.

13. The method of claim 12, wherein the As is implanted in a dose of substantially $4 \times 10^{15}$ atoms/cm$^2$.

* * * * *